United States Patent
Park

(10) Patent No.: US 7,263,025 B2
(45) Date of Patent: Aug. 28, 2007

(54) SEMICONDUCTOR MEMORY DEVICE FOR STABLY CONTROLLING POWER MODE AT HIGH FREQUENCY AND METHOD OF CONTROLLING POWER MODE THEREOF

(75) Inventor: Nak Kyu Park, Kyeongki-do (KR)

(73) Assignee: Hynix Semiconductor Inc., Icheon-si, Kyoungki-do (KR)

( * ) Notice: Subject to any disclaimer, the term of this patent is extended or adjusted under 35 U.S.C. 154(b) by 0 days.

(21) Appl. No.: 11/320,340

(22) Filed: Dec. 29, 2005

(65) Prior Publication Data

US 2007/0019496 A1    Jan. 25, 2007

(30) Foreign Application Priority Data

Jul. 25, 2005    (KR) ...................... 10-2005-0067347

(51) Int. Cl.
*G11C 8/00*    (2006.01)
(52) U.S. Cl. ............ 365/233; 365/189.05; 365/230.08; 365/233.5
(58) Field of Classification Search ................ 365/233, 365/189.05, 230.08, 233.5
See application file for complete search history.

(56) References Cited

U.S. PATENT DOCUMENTS

| | | | | |
|---|---|---|---|---|
| 5,812,491 A | * | 9/1998 | Shinozaki et al. | 365/233 |
| 6,031,786 A | * | 2/2000 | Jang et al. | 365/233 |
| 6,144,614 A | * | 11/2000 | Kanda et al. | 365/233 |
| 6,510,096 B2 | | 1/2003 | Choi et al. | |
| 6,744,687 B2 | | 6/2004 | Koo et al. | |
| 6,865,132 B2 | | 3/2005 | Schaefer et al. | |
| 6,912,169 B2 | | 6/2005 | Choi | |
| 2002/0027234 A1 | | 3/2002 | Kato et al. | |
| 2002/0158275 A1 | | 10/2002 | Choi et al. | |
| 2005/0060487 A1 | | 3/2005 | Barth et al. | |
| 2005/0141321 A1 | | 6/2005 | Kwak | |
| 2005/0195674 A1 | | 9/2005 | Jang | |

FOREIGN PATENT DOCUMENTS

| | | |
|---|---|---|
| JP | 2002-093166 | 3/2002 |
| JP | 2002-358781 | 12/2002 |
| JP | 2004-127478 | 4/2004 |
| KR | 100295042 | 4/2001 |

\* cited by examiner

*Primary Examiner*—Connie C. Yoha
(74) *Attorney, Agent, or Firm*—Lowe Hauptman & Berner, LLP

(57) ABSTRACT

The present invention relates to a semiconductor memory device. When a device exits from power mode, after a time until an instruction/address receive control signal substantially turns on or off an address and instruction input buffer unit and a time until the address and instruction buffer unit is turned on to synchronize an external command signal to an internal clock signal are compensated for, an internal clock-generating control signal for controlling generation of the internal clock signal is sensed at a high phase of a buffered clock signal and is generated at a low phase of the buffered clock signal. Further, when a device enters power mode, an internal clock-generating control signal for controlling generation of an internal clock signal is sensed at a high phase of a buffered clock signal and is then generated at a low phase of the buffered clock signal.

41 Claims, 8 Drawing Sheets

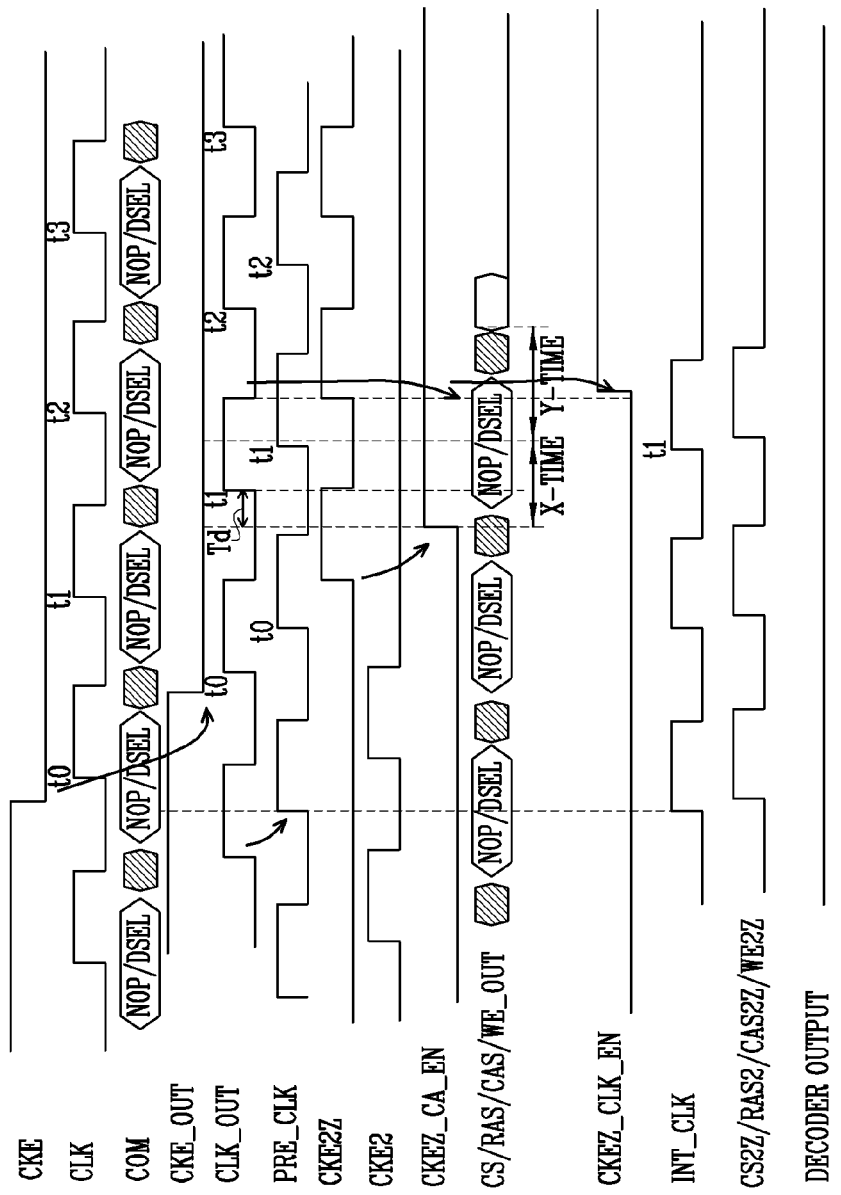

SEMICONDUCTOR MEMORY DEVICE FOR STABLY CONTROLLING POWER MODE AT HIGH FREQUENCY AND METHOD OF CONTROLLING POWER MODE THEREOF

BACKGROUND

1. Field of the Invention

The present invention relates to semiconductor memory devices, and more specifically, to semiconductor memory devices for stably controlling power mode at high frequency, i.e., power-down mode or self-refresh mode and method of controlling power mode thereof.

2. Discussion of Related Art

Power mode includes power-down mode and self-refresh mode. Power-down mode refers to a state where an external clock signal is enabled. Self-refresh mode refers to a state where an external clock signal is disabled. Self-refresh mode can be simply referred to as a state whose power state is deeper than power-down mode. The entry and exit into and from power-down mode and self-refresh mode are indicated by a level of a clock enable signal synchronized to an external clock signal.

FIGS. 1 and 2 are timing diagrams showing the exit from power mode at high frequency in the related art. These drawings show a phenomenon where malfunction is generated upon exit from power mode.

In FIGS. 1 and 2, an X-time refers to a time until an instruction/address receive control signal (CKEZ_CA_EN) turns on or off an input buffer unit (not shown) (for receiving external command signals (COM) such as an address, a row address strobe signal and a chip select). A Y-time refers to a time until the input buffer unit (not shown) is turned on or off and external command signals are synchronized to an internal clock signal (INT_CLK). Furthermore, NO indicates no operation and DSEL indicates delete.

Referring to FIG. 1, at a time point t0 of an external clock signal (CLK), the buffered clock enable signal (CKE_OUT) is enabled to logic high. At a time point t1 of a buffered clock signal (CLK_OUT), the instruction/address receive control signal (CKEZ_CA_EN) shifts from logic high to logic low. At this time, the instruction/address receive control signal (CKEZ_CA_EN) turns on the input buffer unit (not shown) after the X-time. At a time point t2 (dotted line) of the external clock signal (CLK), the external command signal (COM) is received. After the Y-time, buffered command signals (CS/RAS/CAS/WE_OUT) are generated. An internal clock-generating control signal (CKEZ_CLK_EN) is generated by sensing the instruction/address receive control signal (CKEZ_CA_EN) at a low phase of t0 of the buffered clock signal (CLK_OUT). An internal clock signal (INT_CLK) is generated at a high phase of t1 of the buffered clock signal (CLK_OUT). If so, at a time point at which the internal clock signal (INT_CLK) is generated (i.e., before the buffered command signals (CS/RAS/CAS/WE_OUT) are input to a command latch unit (not shown) after the input buffer unit is turned on), invalid command signals (CS2Z/RAS2/CAS2Z/WEZ) are recognized as internal command signals. Thus, an instruction decoder (not shown) outputs an invalid command such as Mode Register Set (MRS), as shown in FIG. 1.

Referring to FIG. 2, in the case where a low phase margin Td of the buffered clock signal (CLK_OUT) t0 is small or almost no in recognizing the instruction/address receive control signal (CKEZ_CA_EN), the internal clock-generating control signal (CKEZ_CLK_EN) shifts to logic low approximately on the middle of a high phase of the buffered clock signal (CLK_OUT) t1. In this case, the internal clock signal (INT_CLK) is generated as an abnormal short pulse (indicated by a circular dotted line in FIG. 2) with its front side being cut. The short pulse of the internal clock signal (INT_CLK) has a close relation with the degree of the low phase margin of the buffered clock signal (CLK_OUT) t0 and a time until the internal clock-generating control signal (CKEZ_CLK_EN) is generated in recognizing the aforementioned instruction/address receive control signal (CKEZ_CA_EN). Such an unstable short pulse has a problem in that it may generate abnormal invalid internal command signals (CS2Z/RAS2/CAS2Z/WEZ) although the buffered command signals (CS/RAS/CAS/WE_OUT) are valid. Furthermore, at the low phase of the external clock signal (CLK) t2, the input buffer unit (not shown) is turned on and the buffered command signals (CS/RAS/CAS/WE_OUT) are cut at a hold line shown in FIG. 2. This results in a short set-up time (Tsetup). As a result, an invalid internal command can be performed.

FIG. 3 is a timing diagram showing the entry into power mode at high frequency in the related art. From FIG. 3, it can be seen that the short pulse of the internal clock signal (INT_CLK) generated upon exit from power mode is also generated upon entry into power mode.

SUMMARY OF THE INVENTION

An advantage of the present invention is to more stably generate an internal clock signal in such a manner that after a time until an instruction/address receive control signal substantially turns on or off an address and instruction input buffer unit and a time until the address and instruction buffer unit is turned on to synchronize an external command signal to an internal clock signal are compensated for, an internal clock-generating control signal for controlling generation of the internal clock signal is sensed at a high phase of a buffered clock signal and is generated at a low phase of the buffered clock signal, when a device exits from power mode.

Another advantage of the present invention is to stably generate an internal clock signal by sensing an internal clock-generating control signal for controlling generation of an internal clock signal at a high phase of a buffered clock signal and generating the sensed signal at a low phase of the buffered clock signal, when a device enters power mode.

According to a first aspect of the present invention, there is provided a semiconductor memory device, including an input buffer unit configured to buffer addresses, command signals, a clock signal and a clock enable signal which are externally input, a clock enable latch configured to latch the buffered clock enable signal and to generate an internal clock enable signal, a control signal generator configured to generate a first control signal for controlling the reception of the addresses and the command signals from the outside and a second control signal for controlling the generation of an internal clock signal, using the internal clock enable signal and the buffered clock signal, an internal clock generator configured to generate the internal clock signal using the buffered clock signal in response to the second control signal, and a latch unit configured to receive the buffered addresses and the command signals in synchronization with the internal clock signal and to generate internal addresses and the command signals. In this case, the input buffer unit buffers the first control signal, while buffering the addresses and the command signals received from the outside in response to the first control signal. Furthermore, the control signal generator generates the first control signal using the buffered clock enable signal, and generates the second control signal by allowing the first control signal and the buffered first control signal to be synchronized to the buffered clock signal.

According to a second aspect of the present invention, there is provided a semiconductor memory device, including an input buffer unit configured to buffer addresses, command signals, a clock signal and a clock enable signal which are externally input, a clock enable latch configured to latch the buffered clock enable signal and to generate an internal clock enable signal, a control signal generator configured to generate a first control signal for controlling the reception of the addresses and the command signals from the outside and a second control signal for controlling the generation of an internal clock signal, using the internal clock enable signal and the buffered clock signal, a delay unit configured to delay the first control signal by a predetermined time and output the delayed first control signal to the control signal generator, an internal clock generator configured to generate the internal clock signal using the buffered clock signal in response to the second control signal, and a latch unit configured to receive the buffered addresses and the command signals in synchronization with the internal clock signal and to generate internal addresses and the command signals. In this case, the control signal generator generates the first control signal using the buffered clock enable signal, and generates the second control signal by allowing the control signal and the delayed first control signal to be synchronized to the buffered clock signal.

According to a third aspect of the present invention, there is provided a method of controlling power mode of a semiconductor memory device, including the steps of receiving and buffering addresses, command signals, a clock signal, and a clock enable signal, which are externally received, latching the buffered clock enable signal to generate an internal clock enable signal, generating a first control signal for controlling the reception of the addresses and the command signals from the outside using the internal clock enable signal, delaying the first control signal by a predetermined time, generating a second control signal for controlling the generation of the internal clock signal by synchronizing the first control signal and the first control signal that is delayed by the predetermined time to the buffered clock signal, generating the internal clock signal using the buffered clock signal in response to the second control signal, and generating internal addresses and the internal command signals using the buffered addresses and the command signals in synchronization with the internal clock signal.

BRIEF DESCRIPTION OF THE DRAWINGS

FIG. 8 is a timing diagram showing the entry into power mode at high frequency, of the semiconductor memory device shown in FIGS. 4 and 5.

DETAILED DESCRIPTION OF PREFERRED EMBODIMENTS

Now, the preferred embodiments according to the present invention will be described with reference to the accompanying drawings. Since preferred embodiments are provided for the purpose that the ordinary skilled in the art are able to understand the present invention, they may be modified in various manners and the scope of the present invention is not limited by the preferred embodiments described later.

Figure 1:
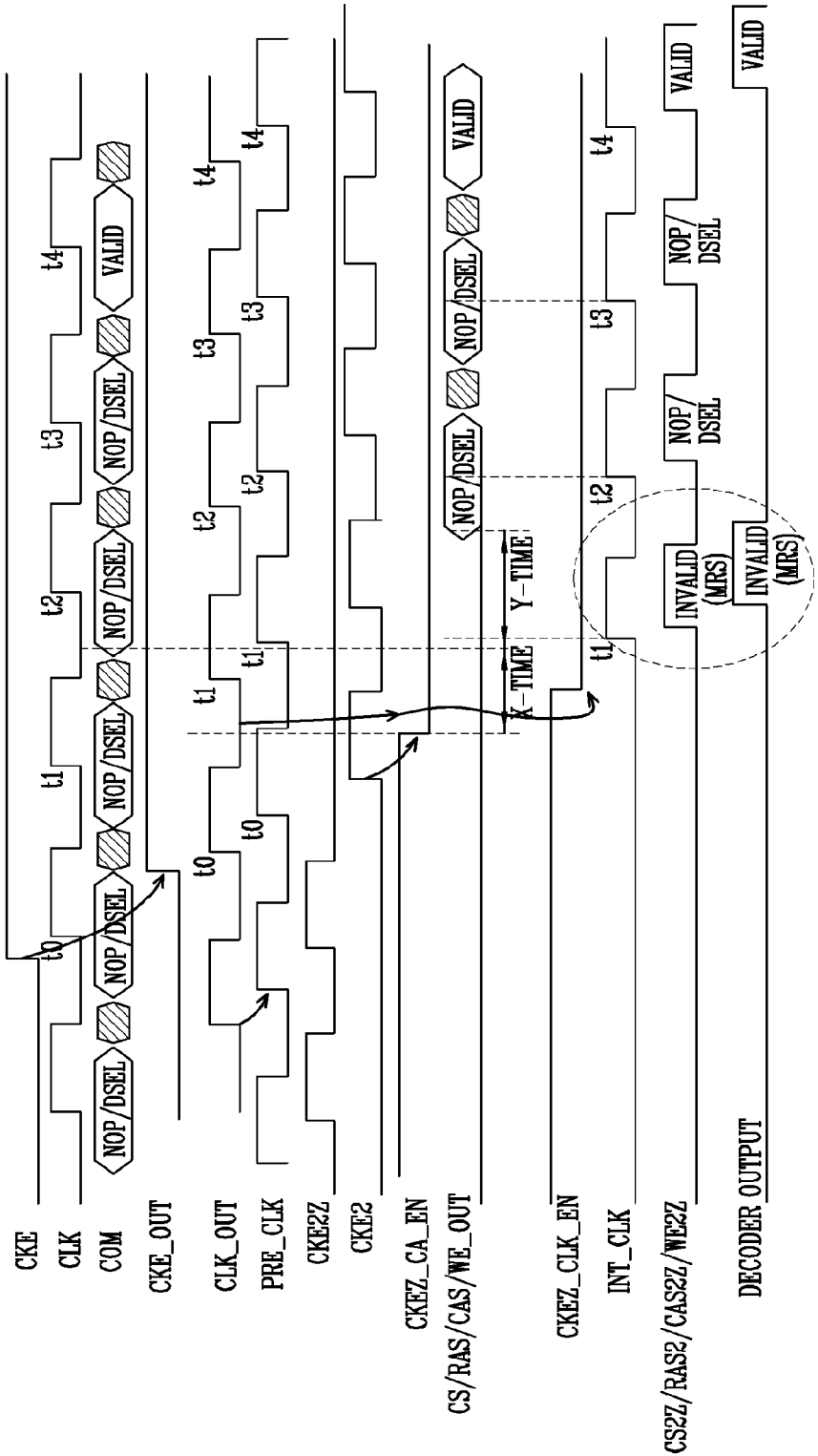
FIGS. 1 and 2 are timing diagrams showing the exit from power mode at high frequency in the related art.
Figure 2:
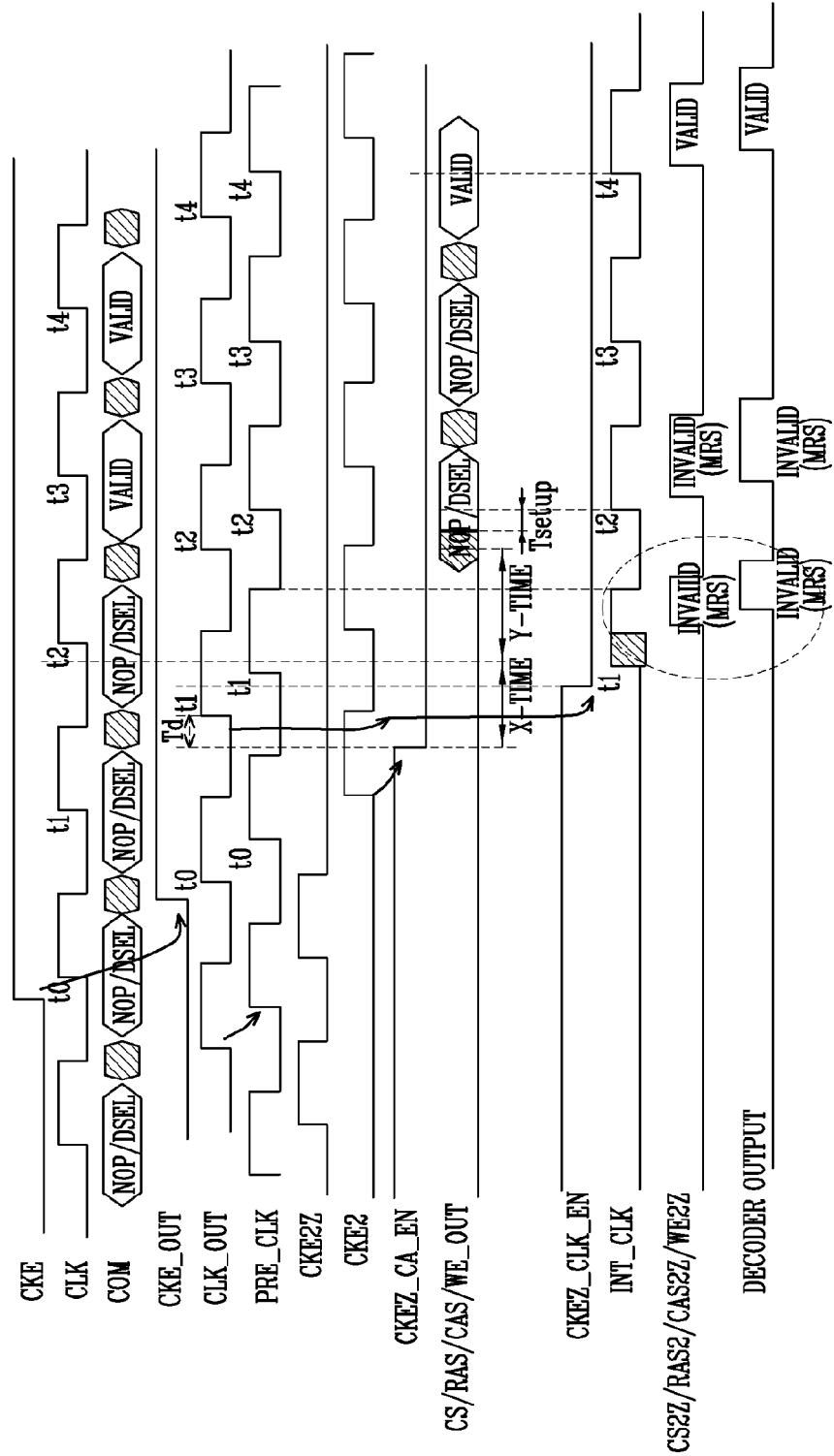
Figure 3:
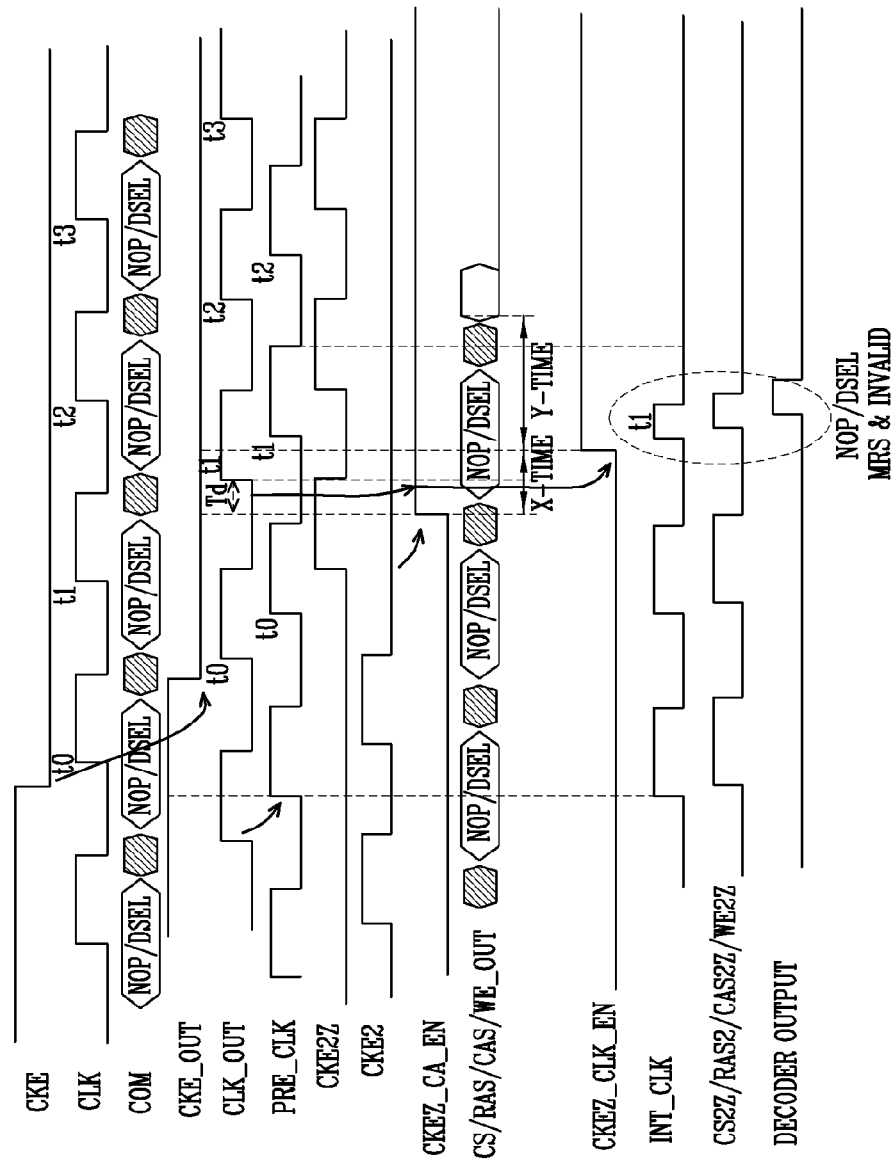
FIG. 3 is a timing diagram showing the entry into power mode at high frequency in the related art.
Figure 4:
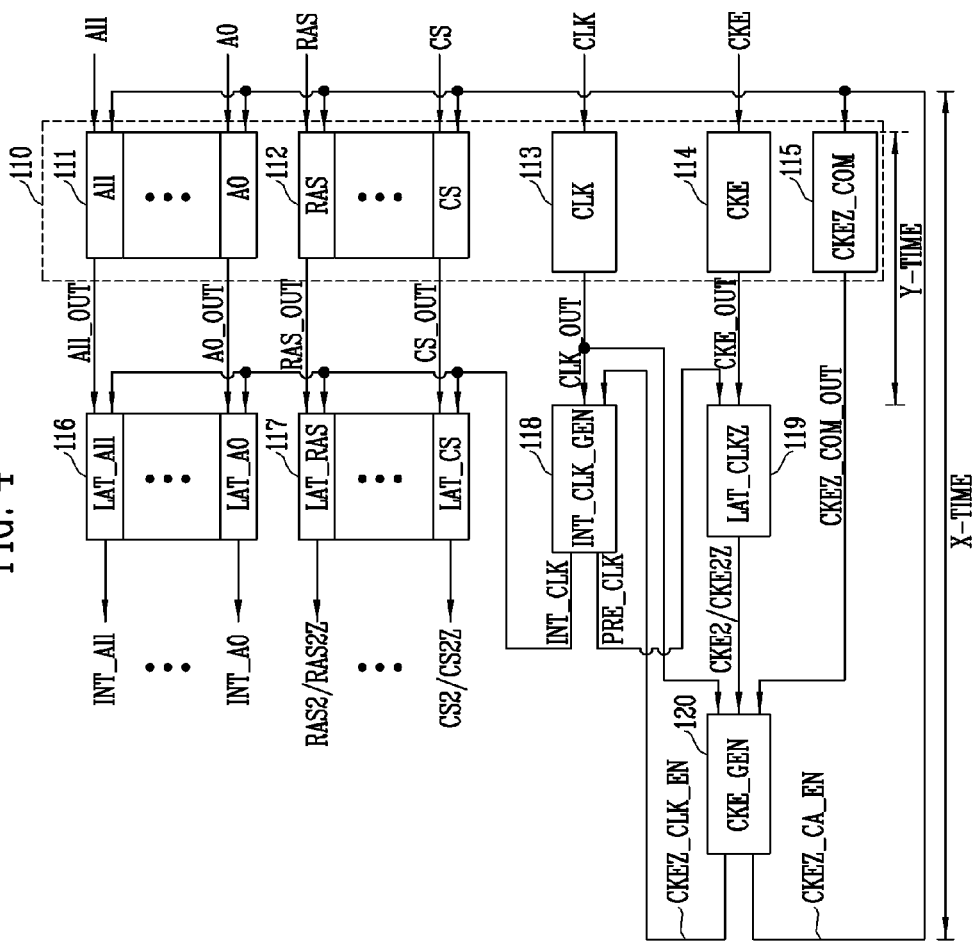
FIG. 4 is a block diagram of a semiconductor memory device for controlling power mode according to a first preferred embodiment of the present invention.

FIG. 4 is a block diagram of a semiconductor memory device for controlling power mode according to a first preferred embodiment of the present invention. FIG. 4 shows the semiconductor memory device which can stably perform the entry and exit into and from power mode at high frequency.

Referring to FIG. 4, the semiconductor memory device includes an address input buffer 111, an instruction input buffer 112, a clock input buffer 113, a clock enable input buffer 114, a control signal input buffer 115, an address latch unit 116, a command latch unit 117, an internal clock generator 118, a clock enable latch 119 and a control signal generator 120. In this case, the address input buffer 111, the instruction input buffer 112, the clock input buffer 113, the clock enable input buffer 114 and the control signal input buffer 115 constitute an input buffer unit 110.

The address input buffer 111 buffers externally input addresses (A0 to A11) and outputs buffered addresses (A0_OUT to A11_OUT). The address latch unit 116 latches received buffered addresses (A0_OUT to A11_OUT) in synchronization with an internal clock signal (INT_CLK) and outputs internal addresses (INT_A0 to INT_A11).

The instruction input buffer 112 buffers command signals such as a MRS row address strobe signal (RAS), a column address strobe signal (CAS), a record enable signal (WE) and a chip select signal (CS), which are received externally, and outputs buffered command signals (RAS_OUT to CS_OUT). The command latch unit 117 receives and latches the buffered command signals (RAS_OUT to CS_OUT) in synchronization with the internal clock signal (INT_CLK), and outputs internal command signals (RAS2/RAS2Z to CS2/CS2Z). The internal command signals (RAS2/RAS2Z to CS2/CS2Z) are input to an instruction decoder (not shown) and are then output as an active signal, a precharge signal, a write signal, a read signal and the like.

The clock buffer unit 113 buffers an externally input clock signal (CLK) and outputs a buffered clock signal (CLK_OUT). The internal clock generator 118 generates an internal clock signal (INT_CLK) of a pulse shape (having a narrow pulse width) at low frequency in response to an internal clock-generating control signal (CKEZ_CLK_EN) and generates an internal clock signal (CLK_INT) having the same cycle as that of the external clock signal (CLK) at high frequency. Furthermore, the internal clock generator 118 generates a clock enable sense signal (PRE_CLK), which is not controlled by a clock enable signal (CKE), and senses a level of the buffered clock enable signal (CKE_OUT). The internal clock signal (INT_CLK) serves to control the output of latched signals within the address latch unit 116 and the command latch unit 117.

The clock enable input buffer 114 buffers the clock enable signal (CKE), which is externally received, and then outputs the buffered clock enable signal (CKE_OUT). The clock enable latch 119 receives the buffered clock enable signal (CKE_OUT) and generates internal clock enable signals (CKE2 and CKE2Z) in synchronization with a clock enable sense signal (PRE_CLK). The internal clock enable signal CKE2Z has an opposite phase to CKE2. If the buffered clock enable signal (CKE_OUT) is logic low, the internal clock enable signal (CKE2Z) is activated in synchronization with the clock enable sense signal (PRE_CLK). If the buffered clock enable signal (CKE_OUT) is logic high, the internal clock enable signal (CKE2) is activated in synchronization with the clock enable sense signal (PRE_CLK).

The control signal input buffer 115 buffers an instruction/address receive control signal (CKEZ_CA_EN) received from the control signal generator 120 and outputs a buffered instruction/address receive control signal (CKEZ_COM_OUT). In this case, the reason why the control signal input buffer 115 is to prevent the internal clock signal (INT_CLK) from being generated before the buffered command signals (A0 to A11_OUT, RAS to CS_OUT) are input to the latch units 116, 177. That is, if the control signal generator 120 generates an internal clock-generating control signal (CKEZ_CLK_EN) in response to a buffered instruction/address receive control signal (CKEZ_COM_OUT) output through the control signal input buffer 115, buffered command signals (A0/A11_OUT, RAS/CS_OUT) are input to the latch units 116, 117, i.e., X-time and Y-time are compensated for, and the internal clock-generating control signal (CKEZ_CLK_EN) is generated. Further, the internal clock signal (INT_CLK) is generated in response to the internal clock-generating control signal (CKEZ_CLK_EN). Accordingly, the conventional problems are not generated.

The control signal generator 120 receives the internal clock enable signals (CKE2/CKE2Z) and generates the instruction/address receive control signal (CKEZ_CA_EN). When the device enters power mode, the control signal generator 120 generates the internal clock-generating control signal (CKEZ_CLK_EN) by sensing an instruction/address receive control signal (CKEZ_CA_EN_PRE shown in FIG. 6) having an opposite phase to the instruction/address receive control signal (CKEZ_CA_EN) at a high phase of the buffered clock signal (CLK_OUT), and outputs it at a low phase of the buffered clock signal (CLK_OUT). The instruction/address receive control signal (CKEZ_CA_EN) is a signal to turn on the address and the instruction input buffers 111, 112 so that external command signals (e.g., A0 to A11, RAS, CS, etc.) are received or to turn off the address and instruction buffer units 111, 112 so that external command signals are prevented from being received.

In contrast, when the device exits from power mode, the control signal generator 120 generates the internal clock-generating control signal (CKEZ_CLK_EN) in such a manner that an instruction/address receive control signal having an opposite phase to the instruction/address receive control signal (CKEZ_CA_EN) and the buffered instruction/address receive control signal (CKEZ_COM_OUT) output from the control signal input buffer 115 are sensed at a high phase of the buffered clock signal (CLK_OUT), and are then output at a low phase of the buffered clock signal (CLK_OUT). As such, if the control signal generator 120 receives the buffered instruction/address receive control signal (CKEZ_COM_OUT) upon exit from power mode, the buffered command signals (A0 to A11_OUT, RAS to CS_OUT), which are generated in response to the instruction/address receive control signal (CKEZ_CA_EN), are input to the latch units 116, 117, i.e., X-time and Y-time are compensated for, and the internal clock-generating control signal (CKEZ_CLK_EN) is then generated at the low phase of the buffered clock signal (CLK_OUT). At this time, the internal clock generator 118 generates the internal clock signal (INT_CLK) in response to the internal clock-generating control signal (CKEZ_CLK_EN) that is generated as described above, i.e., the internal clock signal (INT_CLK) is generated after X-time and Y-time are compensated for. Accordingly, the conventional problems are not generated.

Figure 5:
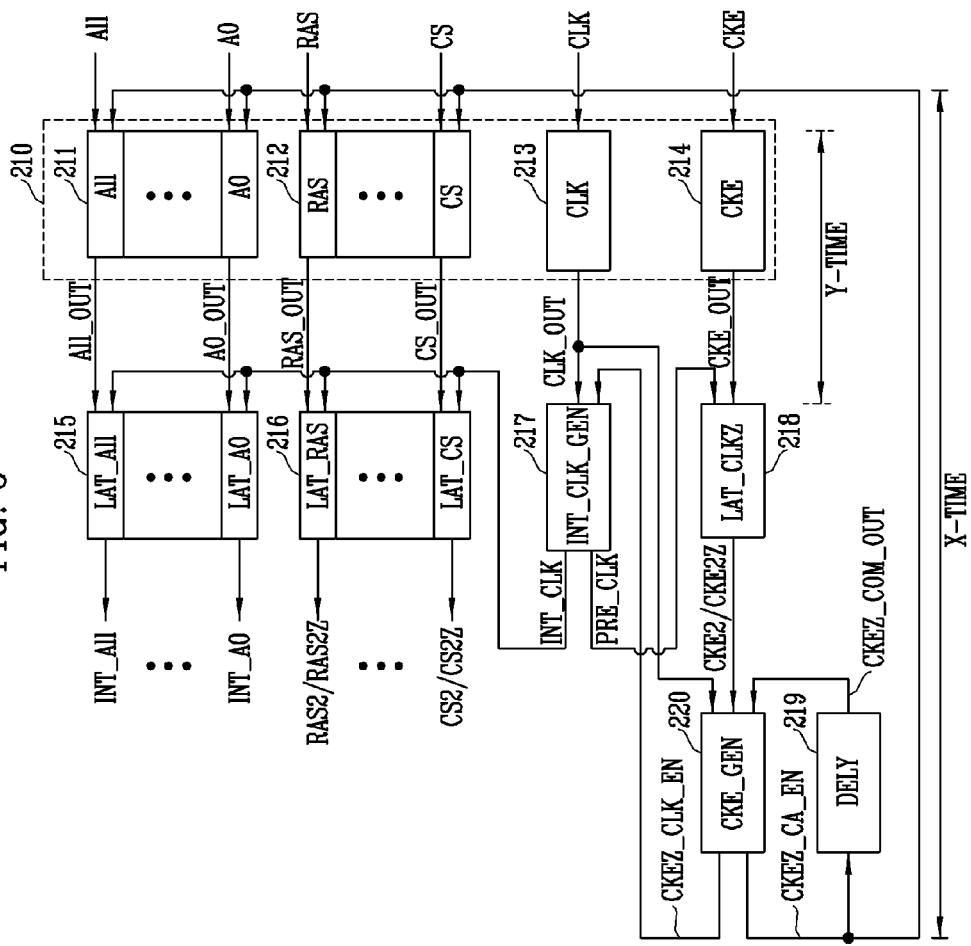
FIG. 5 is a block diagram of a semiconductor memory device for controlling power mode according to a second preferred embodiment of the present invention.

FIG. 5 is a block diagram of a semiconductor memory device for controlling power mode according to a second preferred embodiment of the present invention. FIG. 5 is different from FIG. 4 in that the control signal input buffer 115 is installed in the input buffer unit 110 in FIG. 4, whereas a delay unit 219 exists instead of the control signal input buffer in FIG. 5. The control signal input buffer 115 buffers the instruction/address receive control signal (CKEZ_CA_EN) and outputs it to the control signal generator 120. However, the delay unit 219 delays the instruction/address receive control signal (CKEZ_CA_EN) as much as X-time+Y-time and outputs the delayed signal to the control signal generator 220. Although the internal clock-generating control signal (CKEZ_CLK_OUT) is generated using the instruction/address receive control signal (CKEZ_COM_OUT) that is delayed as much as X-time+Y-time, the same effect as that of FIG. 4 can be obtained.

The constituent elements shown in FIG. 5 have the same construction as those shown in FIG. 4 except for the aforementioned delay unit. Thus, reference can be made to the first embodiment for detailed description of FIG. 5.

Figure 6:
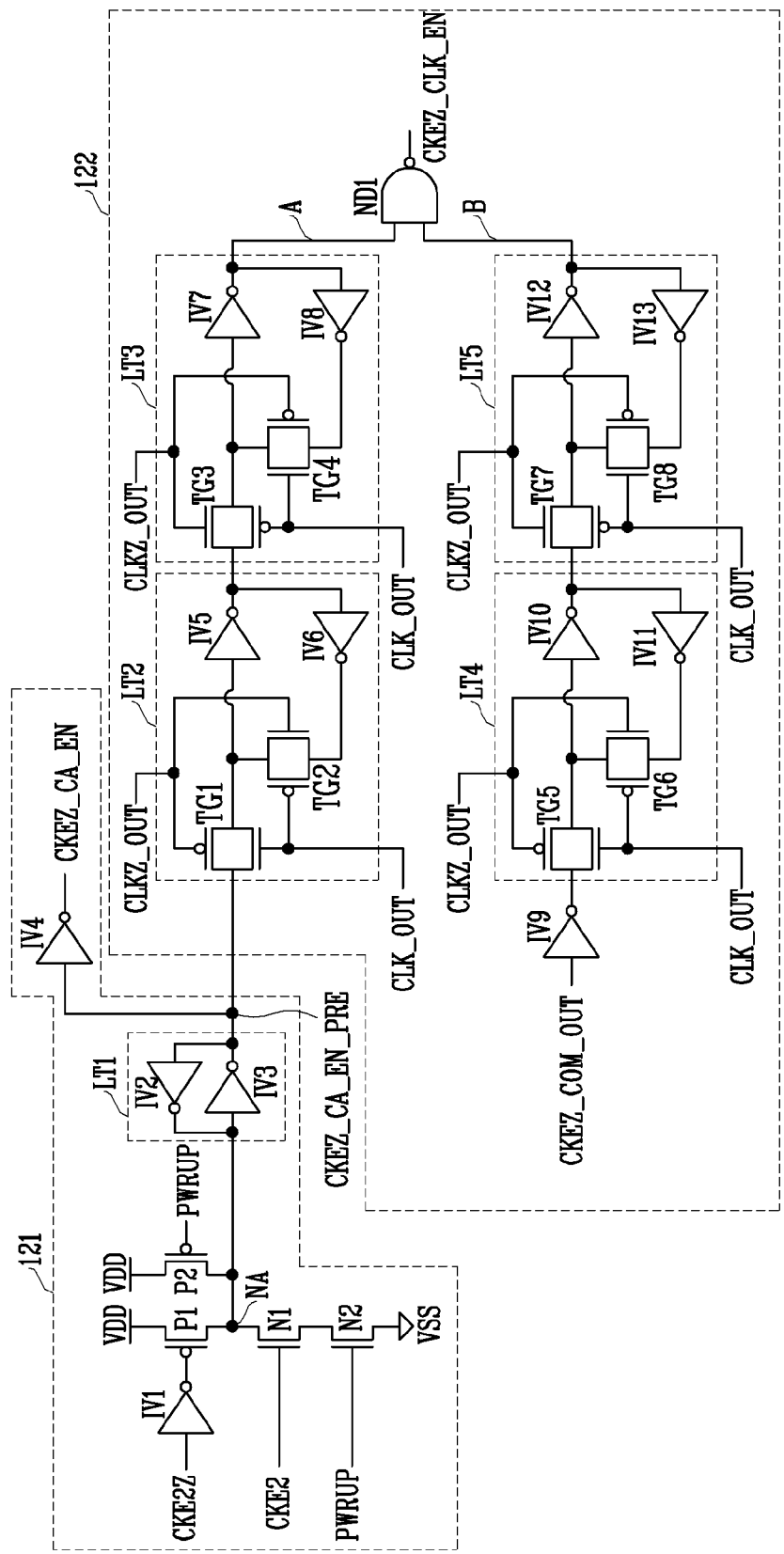
FIG. 6 is a detailed circuit diagram of a control signal generator shown in FIGS. 4 and 5.

FIG. 6 is a detailed circuit diagram of the control signal generator shown in FIGS. 4 and 5.

Referring to FIG. 6, the control signal generator includes a first control signal generator 121 and a second control signal generator 122. The first control signal generator 121 generates the instruction/address receive control signal (CKEZ_CA_EN) using the buffered clock enable signals (CKE2/CKE2Z) and a power-up signal (PWRUP). When the device exits from power mode, the second control signal generator 122 generates the internal clock-generating control signal (CKEZ_CLK_EN), by sensing the instruction/address receive control signal (CKEZ_CA_EN_PRE) and the instruction/address receive control signal (CKEZ_COM_OUT), which is delayed as much as X-time+Y-time, at the high phase of the buffered clock signal (CLK_OUT) and then outputting them at the low phase of the buffered clock signal. In contrast, when the device enters power mode, the second control signal generator 122 generates the internal clock-generating control signal (CKEZ_CLK_EN) by sensing the instruction/address receive control signal (CKEZ_CA_EN_PRE having an opposite phase to CKEZ_CA_EN) at the high phase of the buffered clock signal (CLK_OUT) regardless of the instruction/address receive control signal (CKEZ_COM_OUT), which is delayed as much as X-time+Y-time, and then outputting it at the low phase of the buffered clock signal.

The construction and operation of the first and second control signal generators 121, 122 will be described in detail below.

The first control signal generator 121 includes inverters IV1, IV4, PMOS transistors P1, P2, NMOS transistors N1, N2, and a latch circuit LT1. The inverter IV1 inverts the buffered clock enable signal (CKE2Z) and outputs the inverted signal. The PMOS transistor P1 is connected between a power supply voltage VDD and a node NA and is turned on or off with its gate terminal being applied with the output signal of the inverter IV1. The PMOS transistor P2 is connected between the power supply voltage VDD and the node NA and is turned on or off with its gate terminal being applied with the power-up signal (PWRUP). The NMOS transistors N1, N2 are serially connected between the node NA and a ground voltage VSS. The NMOS transistor N1 is turned on or off with its gate terminal being applied with the buffered clock enable signal (CKE2). The NMOS transistor N2 is turned on or off with its gate terminal being applied with the power-up signal (PWRUP). The latch circuit LT1 latches the signal of the node NA and outputs the latched signal. The inverter IV4 inverts the output signal (CKEZ_CA_EN_PRE) of the latch circuit LT1 and outputs the instruction/address receive control signal (CKEZ_CA_EN). In this case, the power-up signal (PWRUP) is a logic high signal in power mode, i.e., power-down mode and self-refresh mode.

Thereafter, the second control signal generator 122 includes latch circuits LT2 to LT5, an inverter IV9 and an NAND gate ND1. The latch circuit LT2 outputs the instruction/address receive control signal (CKEZ_CA_EN_PRE), which is received from the latch circuit LT1, at the high phase of the buffered clock signal (CLK_OUT). The latch circuit LT3 outputs a signal, which is received from the latch circuit LT2, to the node A at the low phase of the buffered clock signal (CLK_OUT). The inverter IV9 inverts the instruction/address receive control signal (CKEZ_COM_OUT), which is delayed as much as X-time+Y-time, and outputs the inverted signal. The latch circuit LT4 outputs the output signal of the inverter IV9, which is received at the high phase of the buffered clock signal (CLK_OUT). The latch circuit LT5 outputs a signal, which is received from the latch circuit LT2, to the node B at the low phase of the buffered clock signal (CLK_OUT). The NAND gate ND1 performs on an NAND operation on an output signal of the latch circuit LT3 (i.e., a signal of the node A) and an output signal (i.e., a signal of the node B) of the latch circuit LT5, and outputs the internal clock-generating control signal (CKEZ_CLK_EN).

In this case, the latch circuit LT2 includes a latch consisting of two transfer gates TG1, TG2, and a latch consisting of two inverters IV4 and IV5. The transfer gate TG1 transfers the instruction/address receive control signal (CKEZ_CA_EN to PRE) in response to the buffered clock signals (CLK_OUT, CLKZ_OUT). The transfer gate TG2 transfers an output signal of the inverter IV6 to an input terminal of the inverter IV5 in response to the buffered clock signal (CLK_OUT, CLKZ_OUT). The inverter IV5 inverts a signal received from the transfer gate TG1 or TG2, and outputs the inverted signal. The inverter IV6 inverts the output signal of the inverter IV5, and outputs the inverted signal to the transfer gate TG2. The remaining latch circuits LT3 to LT5 have the same construction as that of the latch circuit LT2. Detailed description thereof will be omitted for simplicity.

Figure 7:
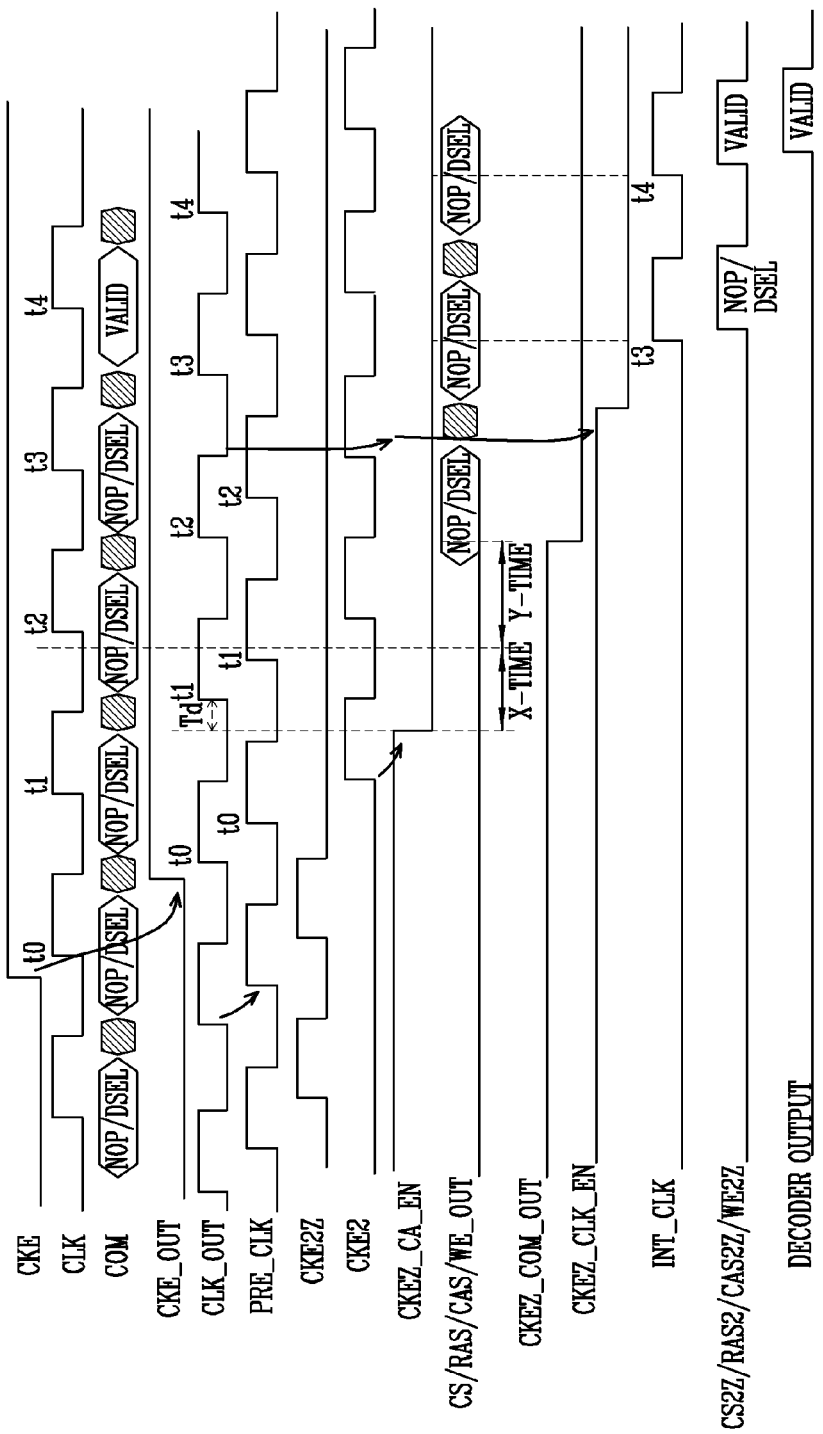
FIG. 7 is a timing diagram showing the exit from power mode at high frequency, of the semiconductor memory device shown in FIGS. 4 and 5.

FIG. 7 is a timing diagram showing the exit from power mode at high frequency. FIG. 8 is a timing diagram showing the entry into power mode at high frequency.

The operation of the control signal generators 120, 220 will be described in detail with reference to FIGS. 6 to 8.

As shown in FIG. 7, if the buffered clock enable signal (CKE2) is logic high, the PMOS transistor P1 is turned off and the NMOS transistor N1 is turned on, so that the node NA is precharged with the ground voltage VSS. At this time, the latch circuit LT1 inverts a signal of the node NA and outputs a logic high signal. In this case, the instruction/address receive control signal (CKEZ_CA_EN) becomes logic low and the output signal (CKEZ_CA_EN_PRE) of the latch circuit LT1 becomes logic high. What the instruction/address receive control signal (CKEZ_CA_EN) is logic low means the exit from power mode. If the instruction/address receive control signal (CKEZ_CA_EN_PR) having an opposite phase as the output signal of the latch circuit LT1, i.e., the instruction/address receive control signal (CKEZ_CA_EN) is logic high, the latch circuit LT2 outputs a logic low signal at the high phase of the buffered clock signal (CLK_OUT) and the latch circuit LT3 outputs a logic high signal to the node A at the low phase of the buffered clock signal (CLK_OUT). Thereafter, if the instruction/address receive control signal (CKEZ_CA_EN) is delayed as much as X-time+Y-time through the control signal input buffer 115 or the delay unit 119 and is then input to the second control signal generator 122 as a logic low signal, the inverter IV9 inverts the delayed instruction/address receive control signal (CKEZ_COM_OUT) of logic low and outputs a logic high signal. The latch circuit LT4 then outputs a logic low signal at the high phase of the buffered clock signal (CLK_OUT), and the latch circuit LT5 outputs a logic high signal to the node B at the low phase of the buffered clock signal (CLK_OUT). At this time, the NAND gate ND1 performs an NAND operation on the logic high signal of the node A and the logic high signal of the node B and outputs the internal clock receive control signal (CKEZ_CLK_EN) of logic low, as shown in FIG. 7. Thereafter, as shown in FIG. 7, the internal clock signal (INT_CLK) is generated and the internal command signals (CS2/CS2Z, RAS2/RAS2Z) are output in synchronization with the internal clock signal (INT_CLK).

In the prior art, before the internal clock-generating control signal (CKEZ_CLK_EN) experiences Y-time, i.e., before the address/instruction input buffers 111, 112, 211 and 212 output the buffered command signals (CA/RAS/CAS/WE_OUT) after the instruction/address receive control signal (CKEZ_CA_EN) is input, it is disabled to logic low and the internal clock signal (INT_CLK) is generated. Thus, a phenomenon in which invalid internal command signals are output is generated. There also occurs a phenomenon in which the waveform of the internal clock signal (INT_CLK) becomes small. In the present invention, however, after the internal clock-generating control signal (CKEZ_CLK_EN) experiences X-time and Y-time as shown in FIG. 7, it is disabled to logic low and the internal clock signal (INT_CLK) is then generated. Accordingly, a phenomenon in which invalid internal command signals are output is not generated. Furthermore, when the low phase of the buffered clock signal (CLK_OUT) t0 has a small margin Td or does not have the margin in recognizing the instruction/address receive control signal (CKEZ_CA_EN) upon exit from power mode, the internal clock-generating control signal (CKEZ_CLK_EN) shifts to logic low at the high phase of the buffered clock signal (CLK_OUT) t1. Accordingly, a phenomenon in which a pulse waveform of the internal clock signal (INT_CLK) becomes small does not happen.

Meanwhile, if the buffered clock signal (CKE2) is logic low as shown in FIG. 8, the PMOS transistor P1 is turned on and the NMOS transistor N1 is turned off, so that the node NA becomes a level of the power supply voltage VDD. At this time, the latch circuit LT1 outputs a logic low signal. In this case, the instruction/address receive control signal (CKEZ_CA_EN) becomes logic high and the output signal (CKEZ_CA_EN_PRE) of the latch circuit LT1 becomes logic low. What the instruction/address receive control signal (CKEZ_CA_EN) is logic high means the entry into power mode. If the instruction/address receive control signal (CKEZ_CA_EN_PRE) is logic low, the latch circuit LT2 outputs a logic high signal at the high phase of the buffered clock signal (CLK_OUT) and the latch circuit LT3 outputs a logic low signal to the node A at the low phase of the buffered clock signal (CLK_OUT). At this time, the internal clock-generating control signal (CKEZ_CLK_OUT) is output as logic high without regard to a level of the instruction/address receive control signal (CKEZ_COM_OUT) that is delayed. That is, in the prior art, when the low phase of the buffered clock signal (CLK_OUT) t0 has a small margin Td or does not have the margin in recognizing the instruction/address receive control signal (CKEZ_CA_EN) upon entry into power mode, the internal clock-generating control signal (CKEZ_CLK_EN) is enabled to logic high at the high phase of the buffered clock signal (CLK_OUT) t1. Accordingly, a phenomenon in which a pulse waveform of the internal clock signal (INT_CLK) becomes small is generated. In the present invention, however, since the internal clock-generating control signal (CKEZ_CLK_EN) is enabled to logic high at the low phase of the buffered clock signal (CLK_OUT) t1 as shown in FIG. 8, a phenomenon in which a pulse waveform of the internal clock signal (INT_CLK) becomes small is not generated.

As described above, according to the present invention, upon exit from power mode (power-down mode or self-refresh mode), the internal clock-generating control signal (CKEZ_CLK_EN) is generated at the low phase of the buffered clock signal (CLK_OUT) after being sensed at the high phase of the buffered clock signal (CLK_OUT), by using the instruction/address receive control signal (CKEZ_COM_OUT) which is generated after a time (X-time) until the instruction/address receive control signal (CKEZ_CA_EN) turns on the input buffer unit 110 or 210 and a time (Y-time) until valid external command signals (A0 to A11, RAS, CS, etc.) are synchronized to the internal clock signal (INT_CLK) are compensated for. It is thus possible to normally generate a waveform of the internal clock signal (INT_CLK) and also to output only valid internal command signals.

Furthermore, according to the present invention, upon entry into power mode (power-down mode or self-refresh mode), after the internal clock-generating control signal (CKEZ_CLK_EN) is sensed at the high phase of the buffered clock signal (CLK_OUT), it is generated at the low phase of the buffered clock signal (CLK_OUT). It is therefore possible to normally generate a waveform of the internal clock signal (INT_CLK).

As described above, according to the present invention, upon entry and exit to and from power mode, short pulses of internal clock signals are prevented from being generated. Accordingly, there is an effect in that generation of invalid internal command signals can be prevented.

Furthermore, according to the present invention, after a turn-on time of an input buffer unit and a time until valid external command signals are synchronized to an internal clock signal are compensated for, the internal clock signal is generated. It is thus possible to perform a stabilized command operation since valid internal command signals are output.

Although the foregoing description has been made with reference to the preferred embodiments, it is to be understood that changes and modifications of the present invention may be made by the ordinary skilled in the art without departing from the spirit and scope of the present invention and appended claims.

What is claimed is:

1. A semiconductor memory device, comprising:
   an input buffer unit configured to buffer addresses, command signals, a clock signal and a clock enable signal which are externally input;
   a clock enable latch configured to latch the buffered clock enable signal and to generate an internal clock enable signal;
   a control signal generator configured to generate a first control signal for controlling the reception of the addresses and the command signals from the outside and a second control signal for controlling the generation of an internal clock signal, using the internal clock enable signal and the buffered clock signal;
   an internal clock generator configured to generate the internal clock signal using the buffered clock signal in response to the second control signal; and
   a latch unit configured to receive the buffered addresses and the command signals in synchronization with the internal clock signal and to generate internal addresses and the command signals,
   wherein the input buffer unit buffers the first control signal, while buffering the addresses and the command signals received from the outside in response to the first control signal, and
   the control signal generator generates the first control signal using the buffered clock enable signal, and generates the second control signal by allowing the first control signal and the buffered first control signal to be synchronized to the buffered clock signal.

2. The semiconductor memory device as claimed in claim 1, wherein the input buffer unit comprises:
   an address/instruction input buffer configured to buffer the addresses and the command signals, which are received externally, in response to the first control signal;
   a clock input buffer configured to buffer the clock signal externally input;
   a clock enable input buffer configured to buffer the clock enable signal externally input; and
   a control signal input buffer configured to buffer the first control signal.

3. The semiconductor memory device as claimed in claim 1, wherein a time when the input buffer unit buffers and outputs the first control signal is the same as a time in which a first time until the first control signal operates the input buffer unit and a second time when the external addresses and the external command signals are synchronized to the internal clock signal by the input buffer unit are compensated for.

4. The semiconductor memory device as claimed in claim 1, wherein the control signal generator generates the second control signal using the buffered first control signal when the semiconductor memory device exits from power mode, and generates the second control signal regardless of the buffered first control signal when the semiconductor memory device enters power mode.

5. The semiconductor memory device as claimed in claim 1, wherein the internal clock generator generates the internal clock signal in response to the second control signal generated using the delayed first control signal when the semiconductor memory device exits from power mode, and does not generate the internal clock signal in response to the second control signal that is generated without regard to the delayed first control signal when the semiconductor memory device enters power mode.

6. The semiconductor memory device as claimed in claim 4, wherein power mode of the semiconductor memory device corresponds to power-down mode where the external clock signal is enabled and toggled, or self-refresh mode where the external clock signal is disabled.

7. The semiconductor memory device as claimed in claim 5, wherein power mode of the semiconductor memory device corresponds to power-down mode where the external clock signal is enabled and toggled, or self-refresh mode where the external clock signal is disabled.

8. The semiconductor memory device as claimed in claim 1, wherein the control signal generator generates the first control signal using the buffered clock enable signal, and then generates the second control signal in such a manner that a signal having an opposite phase to the first control signal is sensed at a high phase of the buffered clock signal regardless of the buffered first control signal and is then output at a low phase of the buffered clock signal, when the semiconductor memory device enters power mode.

9. The semiconductor memory device as claimed in claim 1, wherein the control signal generator generates the first control signal using the buffered clock enable signal, and then generates the second control signal in such a manner that a signal having an opposite phase to the first control signal is sensed at a high phase of the buffered clock signal and is then output at a low phase of the buffered clock signal, and the buffered first control signal is sensed at the high phase of the buffered clock signal and is then output at the low phase of the buffered clock signal, when the semiconductor memory device exits from power mode.

10. The semiconductor memory device as claimed in claim 1, wherein the control signal generator includes a first generator for generating the first control signal using the buffered clock enable signal, and a second generator for generating the second control signal using a signal having an opposite phase to the first control signal and the buffered first control signal, which are received in response to the buffered clock signal.

11. The semiconductor memory device as claimed in claim 10, wherein the first generator comprises:
   a voltage generator for making a first node have a first logic level using an inverse signal of the buffered clock enable signal when the semiconductor memory device enters power mode, and making the first node have a second logic level using the buffered clock enable signal when the semiconductor memory device exits from power mode;
   a latch circuit for latching a signal of the first node to output an inverse signal of the signal of the first node; and
   an inverse element for inverting the output signal of the latch circuit to output the first control signal.

12. The semiconductor memory device as claimed in claim 10, wherein the second generator comprises:
   a first latch unit for sensing a signal having an opposite phase to the first control signal at a high phase of the buffered clock signal and outputting the sensed signal at a low phase of the buffered clock signal;
   a second latch unit for sensing the buffered first control signal at the high phase of the buffered clock signal and outputting the sensed signal at the low phase of the buffered clock signal; and
   an output unit for logically combining the output signals of the first and second latch units to output the second control signal.

13. The semiconductor memory device as claimed in claim 12, wherein the first latch unit comprises a first latch circuit for receiving and outputting a signal having an opposite phase to the first control signal at the high phase of the buffered clock signal, and a second latch circuit for receiving and outputting the output signal of the first latch circuit at the low phase of the buffered clock signal.

14. The semiconductor memory device as claimed in claim 12, wherein the second latch unit comprises a first latch circuit for receiving and outputting the buffered first control signal at the high phase of the buffered clock signal, and a second latch circuit for receiving and outputting the output signals of the first latch circuit at the low phase of the buffered clock signal.

15. The semiconductor memory device as claimed in claim 1, wherein the internal clock generator generates a clock enable sense signal for sensing a level of the buffered clock enable signal while generating the internal clock signal.

16. The semiconductor memory device as claimed in claim 15, wherein the clock enable latch receives the buffered clock enable signal, and generates the internal clock enable signal and an inverse signal of the internal clock enable signal in synchronization with the clock enable sense signal.

17. A semiconductor memory device, comprising:
   an input buffer unit configured to buffer addresses, command signals, a clock signal and a clock enable signal which are externally input;
   a clock enable latch configured to latch the buffered clock enable signal and to generate an internal clock enable signal;
   a control signal generator configured to generate a first control signal for controlling the reception of the addresses and the command signals from the outside and a second control signal for controlling the generation of an internal clock signal, using the internal clock enable signal and the buffered clock signal;
   a delay unit configured to delay the first control signal by a predetermined time and output the delayed first control signal to the control signal generator;
   an internal clock generator configured to generate the internal clock signal using the buffered clock signal in response to the second control signal; and
   a latch unit configured to receive the buffered addresses and the command signals in synchronization with the internal clock signal and to generate internal addresses and the command signals,
   wherein the control signal generator generates the first control signal using the buffered clock enable signal, and generates the second control signal by allowing the control signal and the delayed first control signal to be synchronized to the buffered clock signal.

18. The semiconductor memory device as claimed in claim 17, wherein the input buffer unit comprises:
   an address/instruction input buffer configured to buffer the addresses and the command signals, which are received externally, in response to the first control signal;
   a clock input buffer configured to buffer the clock signal externally input; and
   a clock enable input buffer configured to buffer the clock enable signal externally input.

19. The semiconductor memory device as claimed in claim 17, wherein the delay unit outputs the delayed first control signal, which is delayed as much as a time in which a first time until the first control signal operates the input buffer unit and a second time until the external addresses and the external command signals are synchronized to the internal clock signal are added.

20. The semiconductor memory device as claimed in claim 17, wherein the control signal generator generates the second control signal in response to the delayed first control signal when the semiconductor memory device exits from power mode, and generates the second control signal regardless of the delayed first control signal when the semiconductor memory device enters power mode.

21. The semiconductor memory device as claimed in claim 17, wherein the internal clock generator generates the internal clock signal in response to the second control signal generated using the delayed first control signal when the semiconductor memory device exits from power mode, and does not generate the internal clock signal in response to the second control signal that is generated without regard to the delayed first control signal when the semiconductor memory device enters power mode.

22. The semiconductor memory device as claimed in claim 20, wherein power mode of the semiconductor memory device corresponds to power-down mode where the external clock signal is enabled and toggled, or self-refresh mode where the external clock signal is disabled.

23. The semiconductor memory device as claimed in claim 21, wherein power mode of the semiconductor memory device corresponds to power-down mode where the external clock signal is enabled and toggled, or self-refresh mode where the external clock signal is disabled.

24. The semiconductor memory device as claimed in claim 17, wherein the control signal generator generates the first control signal using the buffered clock enable signal, and then generates the second control signal in such a manner that a signal having an opposite phase to the first control signal is sensed at a high phase of the buffered clock signal regardless of the delayed first control signal and is then output at a low phase of the buffered clock signal, when the semiconductor memory device enters power mode.

25. The semiconductor memory device as claimed in claim 17, wherein the control signal generator generates the first control signal using the buffered clock enable signal, and then generates the second control signal in such a manner that a signal having an opposite phase to the first control signal is sensed at a high phase of the buffered clock signal and is then output at a low phase of the buffered clock signal, and the delayed first control signal is sensed at the high phase of the buffered clock signal and is then output at the low phase of the buffered clock signal, when the semiconductor memory device exits from power mode.

26. The semiconductor memory device as claimed in claim 17, wherein the control signal generator includes a first generator for generating the first control signal using the buffered clock enable signal, and a second generator for generating the second control signal using a signal having an opposite phase to the first control signal and the delayed first control signal, which are received in response to the buffered clock signal.

27. The semiconductor memory device as claimed in claim 26, wherein the second generator comprises:
a first latch unit for sensing a signal having an opposite phase to the first control signal at a high phase of the buffered clock signal and outputting the sensed signal at a low phase of the buffered clock signal;
a second latch unit for sensing the delayed first control signal at the high phase of the buffered clock signal and outputting the sensed signal at the low phase of the buffered clock signal; and
an output unit for logically combining the output signals of the first and second latch units to output the second control signal.

28. The semiconductor memory device as claimed in claim 27, wherein the first latch unit comprises a first latch circuit for receiving and outputting a signal having an opposite phase to the first control signal at the high phase of the buffered clock signal, and a second latch circuit for receiving and outputting the output signal of the first latch circuit at the low phase of the buffered clock signal.

29. The semiconductor memory device as claimed in claim 27, wherein the second latch unit comprises a first latch circuit for receiving and outputting the delayed first control signal at the high phase of the buffered clock signal, and a second latch circuit for receiving and outputting the output signals of the first latch circuit at the low phase of the buffered clock signal.

30. The semiconductor memory device as claimed in claim 17, wherein the internal clock generator generates a clock enable sense signal for sensing a level of the buffered clock enable signal while generating the internal clock signal.

31. The semiconductor memory device as claimed in claim 30, wherein the clock enable latch receives the buffered clock enable signal, and generates the internal clock enable signal and an inverse signal of the internal clock enable signal in synchronization with the clock enable sense signal.

32. A method of controlling power mode of a semiconductor memory device, comprising the steps of:
receiving and buffering addresses, command signals, a clock signal, and a clock enable signal, which are externally received;
latching the buffered clock enable signal to generate an internal clock enable signal;
generating a first control signal for controlling the reception of the addresses and the command signals from the outside using the internal clock enable signal;
delaying the first control signal by a predetermined time;
generating a second control signal for controlling the generation of the internal clock signal by synchronizing the first control signal and the first control signal that is delayed by the predetermined time to the buffered clock signal;
generating the internal clock signal using the buffered clock signal in response to the second control signal; and
generating internal addresses and the internal command signals using the buffered addresses and the command signals in synchronization with the internal clock signal.

33. The method as claimed in claim 32, wherein the first control signal is delayed as much as a time in which a first time until the external addresses and the external command signals are received and a second time until the external addresses and the external command signals are synchronized to the internal clock signal are added in response to the first control signal.

34. The method as claimed in claim 32, wherein when the semiconductor memory device exits from power mode, the second control signal is generated in response to the delayed first control signal, and when the semiconductor memory device enters power mode, the second control signal is generated without regard to the delayed first control signal.

35. The method as claimed in claim 32, wherein when the semiconductor memory device exits from power mode, the internal clock signal is generated in response to the second control signal generated using the delayed first control signal, and when the semiconductor memory device enters power mode, the internal clock signal is generated in response to the second control signal generated regardless of the delayed first control signal.

36. The method as claimed in claim 34, wherein power mode of the semiconductor memory device refers to power-down mode where the external clock signal is enabled and toggled, or self-refresh mode where the external clock signal is disabled.

37. The method as claimed in claim 35, wherein power mode of the semiconductor memory device refers to power-down mode where the external clock signal is enabled and toggled, or self-refresh mode where the external clock signal is disabled.

38. The method as claimed in claim 32, wherein when the semiconductor memory device enters power mode, the first control signal is generated using the buffered clock enable signal, and the second control signal is generated by sensing a signal having an opposite phase to the first control signal at a high phase of the buffered clock signal regardless of the delayed first control signal and then outputting the sensed signal at a low phase of the buffered clock signal.

39. The method as claimed in claim 32, wherein when the semiconductor memory device exits from power mode, the first control signal is generated using the buffered clock enable signal, and the second control signal is then generated in such a manner that a signal having an opposite phase to the first control signal is sensed at a high phase of the buffered clock signal and is then output at a low phase of the buffered clock signal, and the buffered first control signal is sensed at the high phase of the buffered clock signal and is then output at the low phase of the buffered clock signal, when the semiconductor memory device exits from power mode.

40. The method as claimed in claim 32, wherein when the internal clock signal is generated, a clock enable sense signal for sensing a level of the buffered clock enable signal is generated.

41. The method as claimed in claim 40, wherein the internal clock enable signal and an inverse signal of the internal clock enable signal are generated using the buffered clock enable signal in response to the clock enable sense signal.

* * * * *